United States Patent [19]
Hacke

[11] Patent Number: 6,157,541
[45] Date of Patent: Dec. 5, 2000

[54] STACK ARRANGEMENT FOR TWO SEMICONDUCTOR MEMORY CHIPS AND PRINTED BOARD FOR ACCEPTING A PLURALITY OF SUCH STACK ARRANGEMENTS

[75] Inventor: Hans-Juergen Hacke, Munich, Germany

[73] Assignee: Siemens Aktiengesellschaft, Munich, Germany

[21] Appl. No.: 09/216,978

[22] Filed: Dec. 21, 1998

[30] Foreign Application Priority Data

Dec. 30, 1997 [DE] Germany .............................. 197 58 197

[51] Int. Cl.[7] ...................................................... H05K 1/14
[52] U.S. Cl. ............................ 361/749; 361/750; 361/751; 361/760; 361/807; 174/254; 174/255; 174/260; 257/723; 257/686
[58] Field of Search ....................................... 361/749, 750, 361/751, 760, 807, 765, 772, 777, 783; 174/250, 254, 255, 260; 257/723, 686; 439/629, 638

[56] References Cited

U.S. PATENT DOCUMENTS

| | | | |
|---|---|---|---|
| 5,224,023 | 6/1993 | Smith et al. | 361/784 |
| 5,448,511 | 9/1995 | Paurus et al. | 365/52 |
| 5,708,297 | 1/1998 | Clayton | 257/723 |
| 5,789,815 | 8/1998 | Tessier et al. | 257/723 |
| 5,949,657 | 9/1999 | Karabatos | 361/803 |
| 6,021,048 | 2/2000 | Smith | 361/736 |

FOREIGN PATENT DOCUMENTS

| | | |
|---|---|---|
| 6-97621 | 4/1992 | Japan . |
| 2 203 905 | 10/1988 | United Kingdom . |

Primary Examiner—Jeffrey Gaffin
Assistant Examiner—David Foster
Attorney, Agent, or Firm—Schiff Hardin & Waite

[57] ABSTRACT

Two semiconductor memory chips are placed onto a flexible wiring and are shaped by simple folding of the flexible wiring about a central elastic line, into a space-efficient stack arrangement whose outer contacts are formed only at one marginal side. To form memory cards, a plurality of such stack arrangements can be placed onto a simply constructed printed board.

13 Claims, 8 Drawing Sheets

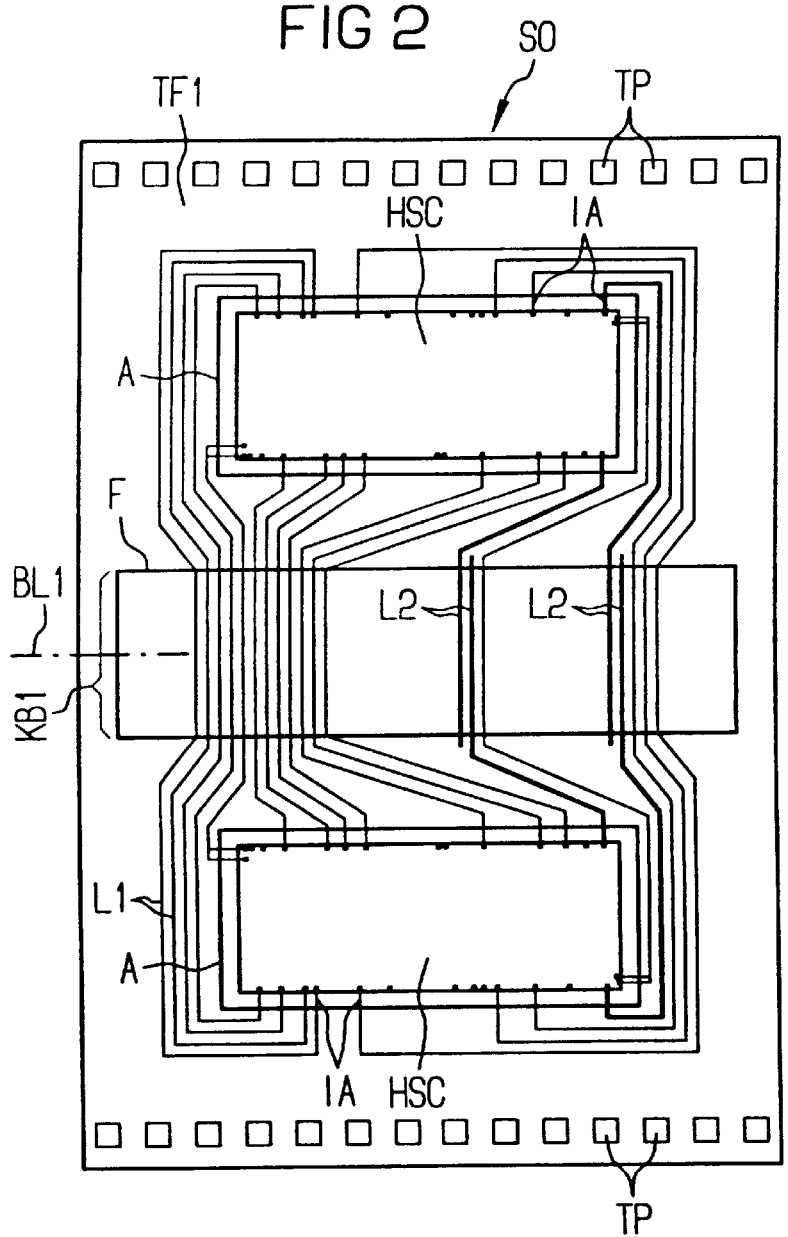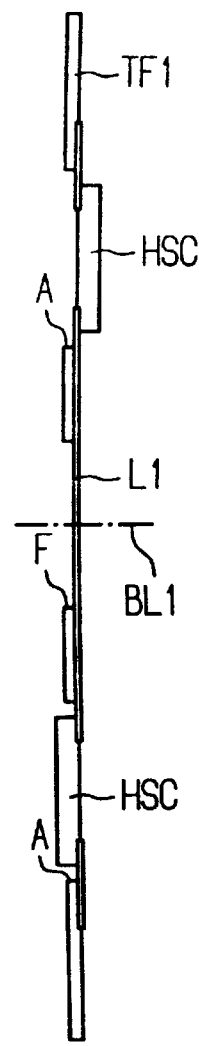

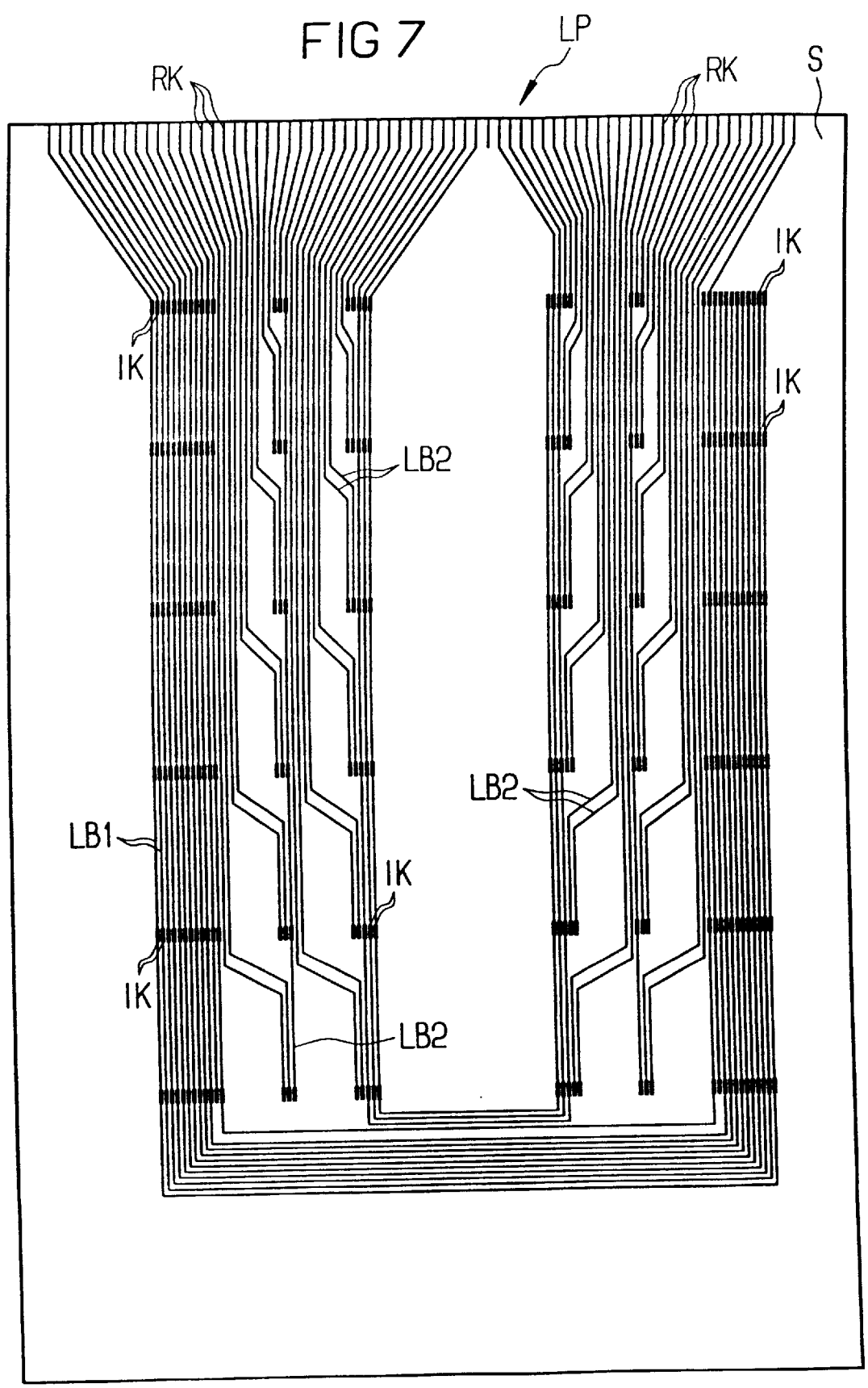

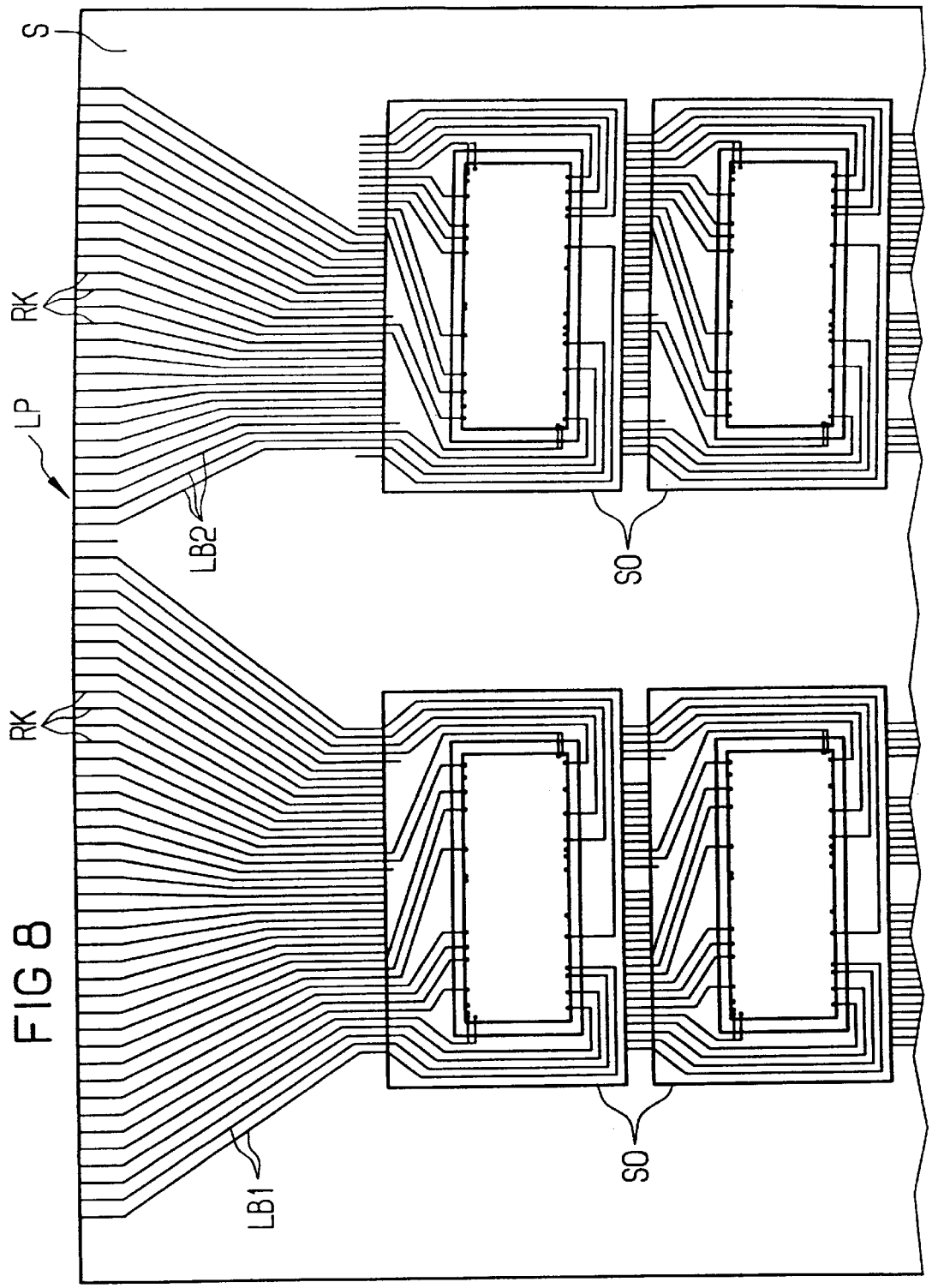

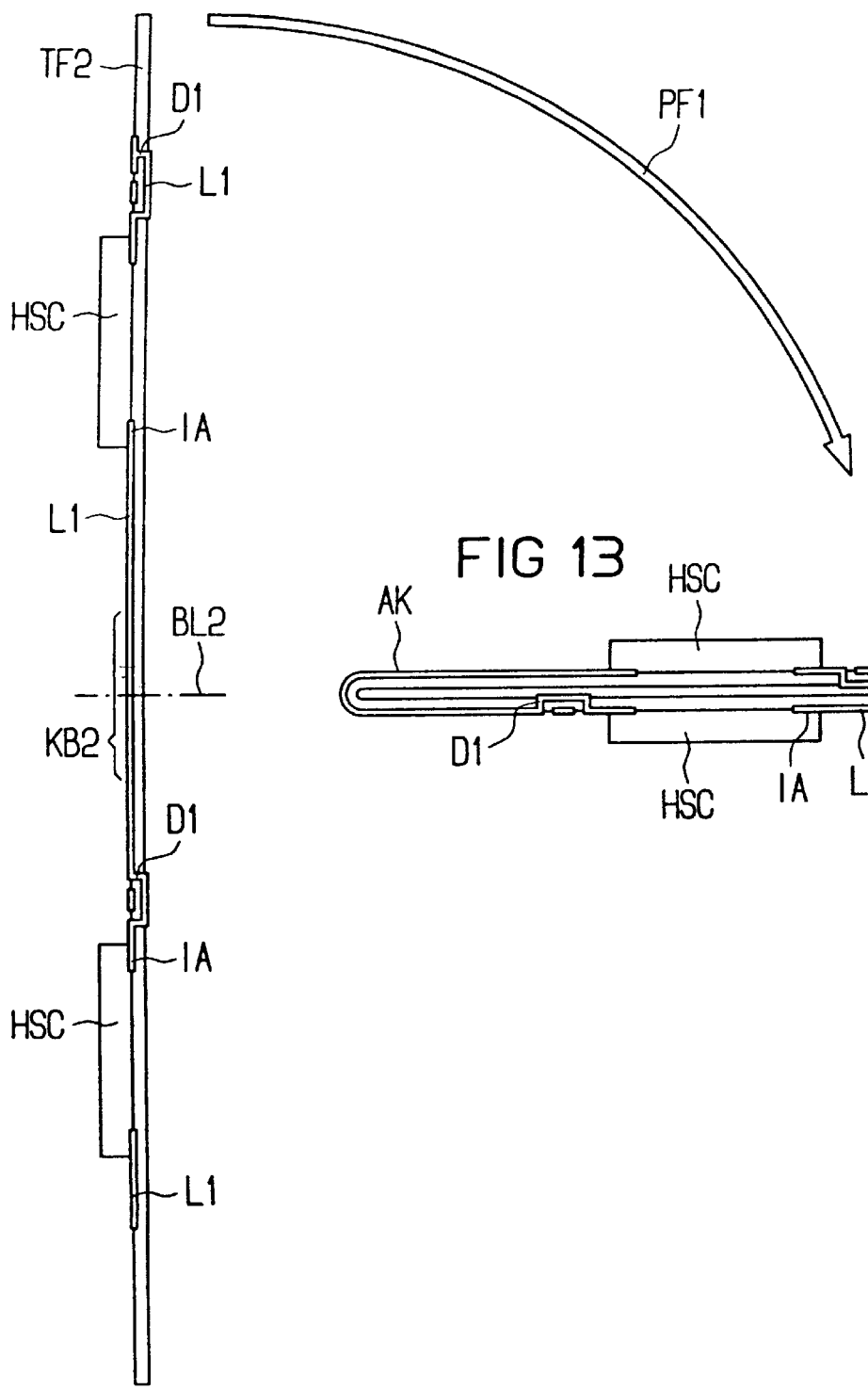

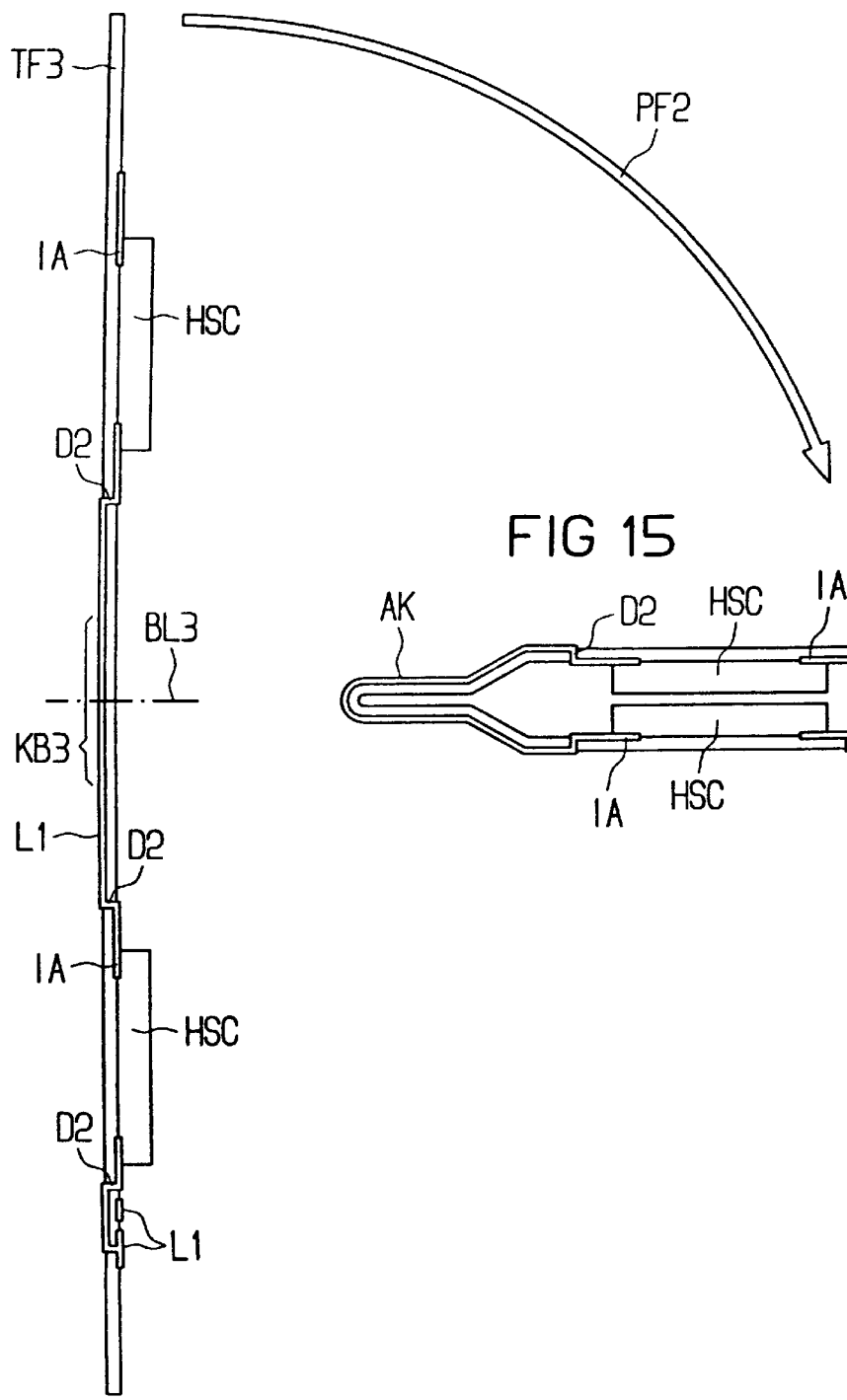

STACK ARRANGEMENT FOR TWO SEMICONDUCTOR MEMORY CHIPS AND PRINTED BOARD FOR ACCEPTING A PLURALITY OF SUCH STACK ARRANGEMENTS

BACKGROUND OF THE INVENTION

In the field of computer applications, greater and greater memory capacities are required. This is also true for personal computers, which are becoming more and more popular. Market demands such as mobility, comfort, versatility, etc. are important incentives for progressive integration and further miniaturization of the packing technology. Thus, in the development of semiconductor memory chips, a quadrupling of the capacity can be expected every two years. Nevertheless, with each generation of semiconductor memory chips it is necessary to employ packing techniques which achieve the greatest possible total capacities.

While in the past the semiconductor memory chips in personal computers have been soldered onto motherboards, particularly in plug-in assembly, memory cards are being used more and more. These memory cards contain numerous semiconductor memory chips of the same kind in a narrow space and can be used easily by the user. Chip modules which likewise contain a plurality of semiconductor memory chips have been known for some time, but usually these must be soldered onto motherboards.

In the field of memory cards, a committee for standardization has formed which has since come to be known under the designation PCMCIA (Personal Computer Memory Card International Association). Accordingly, memory cards have a format of 60×94 mm and 68 terminals, given a thickness of up to 3.3 mm (type I), of up to 5 mm (type II), of up to 10.5 mm (type II), and, in planning, up to 16.5 mm (type IV). Such memory cards are easy to handle and are provided specifically for future use in laptops and notebooks. The conventional construction involves the assembly of housed semiconductor memory chips on printed boards in what is known as SMT (Surface Mount Technology). The wire bonding of non-encapsulated semiconductor memory chips onto the wiring is also known. Due to the necessary meshing of the semiconductor memory chips with each other, double-sided or multilayered wirings are necessary.

SUMMARY OF THE INVENTION

It is an object of the invention to design a more simple condensing of semiconductor chips of the same type in a tight space, thus enabling a cost-effective production.

According to the present invention, a stack arrangement is provided for first and second semiconductor memory chips. A flexible carrier film is provided which is made of an electrically insulating material. A first configuration of inner terminals are provided onto which first contacts of the first semiconductor memory chip are bonded. A second configuration of inner terminals are provided onto which first contacts of the second semiconductor memory chip are bonded. A first group of conductors on the carrier film cross a strip-shaped bonding region and connect to both the first configuration of inner terminals and the second configuration of inner terminals so as to jointly control respective first contacts of the first and second semiconductor memory chips. A second group of conductors are provided on the flexible carrier film which extend into the strip-shaped bonding region and are connected to inner terminals of the first or second terminal configurations which are bonded with second contacts of the respective first and second semiconductor memory chips which are selectively controllable for each memory chip. The flexible carrier film is folded about an elastic line which is situated in the strip-shaped bonding region such that the two semiconductor memory chips are arranged above one another in stack fashion, and the individual conductors in the folded bonding region forming outer contacts which are situated in adjacent fashion in one row.

The invention is based on the acknowledgment that two semiconductor memory chips can be placed onto a flexible wiring and can be reshaped, by simple folding of the flexible wiring, into a space-efficient double-stack whose outer contacts are constructed on only one side of the stack arrangement. On the other hand, by means of this construction, a plurality of such stack arrangements can be placed onto simply constructed printed boards; i.e., the present invention enables a simple construction of memory cards.

Relying on the TAB (Tape Automated Bonding) technique, this development of the invention enables the bonding of one semiconductor memory chip in the face-up position, and the bonding of the other semiconductor memory chip in the face-down position, by means of the inner terminals which project freely over recesses in the carrier film. A mirror-symmetrical arrangement of the terminal configurations is thus enabled with a simple leading of all conductors on only one side of the carrier film, without transpositions or crossings.

By means of the window built into the carrier film in the strip-shaped contact region, this development of the invention facilitates the folding of the carrier film into a stack arrangement.

A particularly simple stacking is enabled in the invention since, subsequent to the folding of the carrier foil, the two semiconductor memory chips are congruently situated in the same position as the terminals and above one another.

With the utilization of a multilayered plated-through flexible wiring, this development of the invention enables the formation of a stack arrangement in which the two semiconductor memory chips are placed on one side. In case of a transposition, the conductors go onto the other side, but they are nevertheless led jointly via the strip-shaped bonding region.

The invention also enables the arrangement of a great number of stack arrangements in a very tight space, whereby the leading of the interconnects is particularly simple and clear.

Also in a development of the invention, the printed board is realized as a particularly simple and cost-effective wiring on one side.

In further developments of the invention, the individual stack arrangements can be mounted on the printed board such that they lie flat, lap obliquely, or stand upright. The actual number of the stack arrangements to be accommodated on the printed board depends not only on the selection of the assembly arrangement but also on the number of inner terminals to be selectively actuated, the number of inner contacts available on the printed board, the heat loss of the semiconductor chips, and the measures to be taken for cooling.

BRIEF DESCRIPTION OF THE DRAWINGS

FIG. 2 is a plan view of a stack arrangement for two semiconductor memory chips prior to the folding of the flexible carrier film;

FIG. 3 is a side view of the unfolded stack arrangement according to FIG. 2;

FIG. 7 is a plan view of a printed board provided for accepting 12 stack arrangements;

FIG. 8 is a partial plan view of the printed board according to FIG. 7, on which stack arrangements have been assembled;

FIG. 12 is a side view of a second embodiment of a stack arrangement for two semiconductor memory chips, prior to the folding of the flexible carrier film;

FIG. 13 is a side view of the stack arrangement according to FIG. 12, subsequent to the folding of the flexible carrier film;

FIG. 14 is a side view of a third embodiment of a stack arrangement for two semiconductor chips, prior to the folding of the flexible carrier film; and FIG. 15 is a side view of the stack arrangement according to FIG. 14, subsequent to the folding of the flexible carrier film.

DESCRIPTION OF THE PREFERRED EMBODIMENTS

Figure 1:
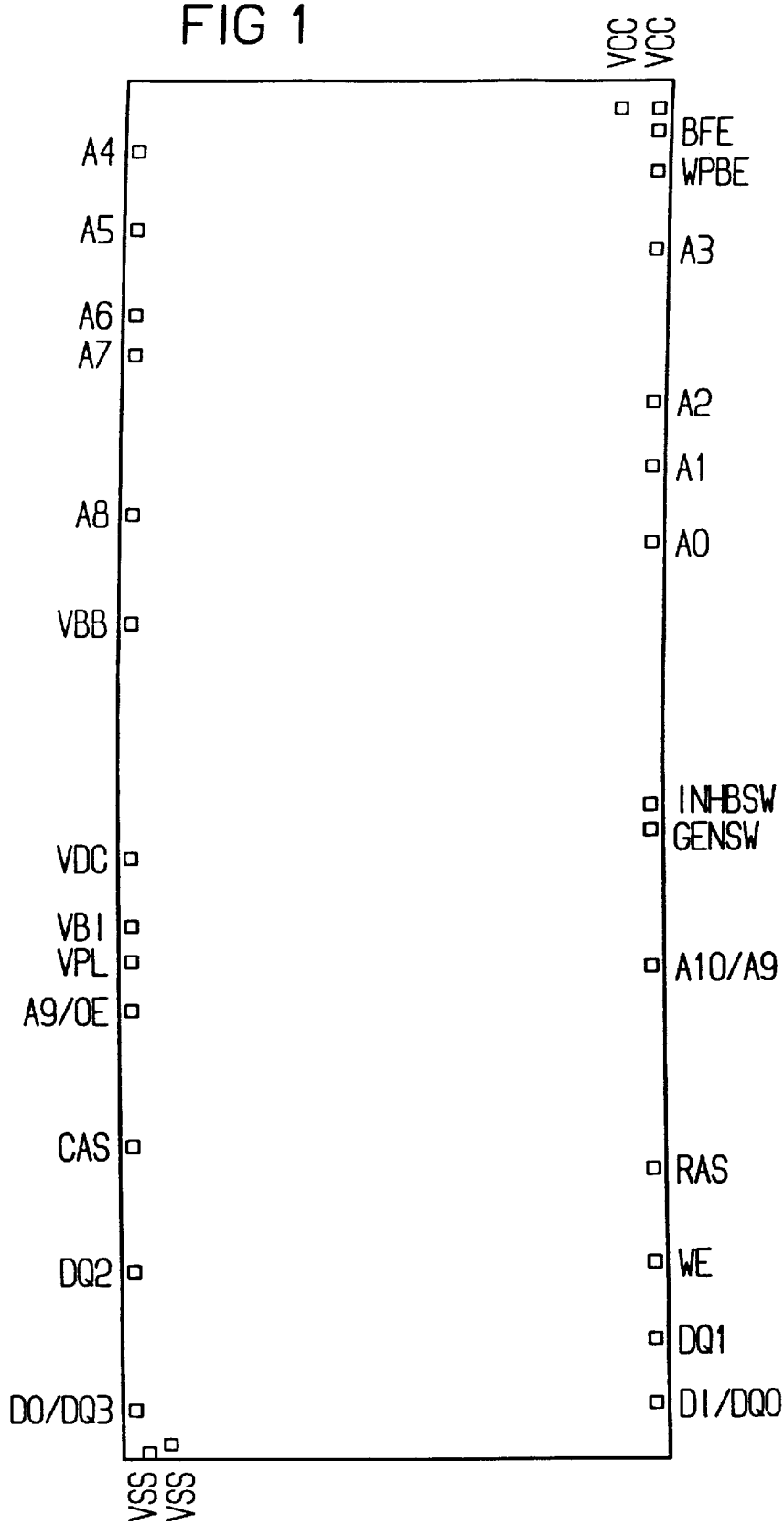
FIG. 1 is a plan view of the terminals of a semiconductor memory chip.

Groups of semiconductor chips can be wired such that most of their terminals are connected in parallel fashion, and only a few are used for their selective actuation. There are a total of 30 recognizable terminals in the 4M chip which is depicted in FIG. 1 as an example of a semiconductor memory chip HSC. Eighteen to twenty pins lead from these 30 terminals in the single-housing construction. The two terminals VSS and the two terminals VCC are respectively combined.

The terminals WPBE and BFE serve for the setting of the type of operation and are either open (normal) or set at VCC. They are forgone in the given exemplary embodiment. All the analysis terminals VBB, VDC, VBI, VPL, GENSW, INHBSW and DQ1 and DQ2 are also forgone.

In the extreme case 13, jointly actuatable terminals VCC, A3, A2, A1, A0, A10/A9, VSS, A9/OE, A8, A7, A6, A5 and A4 remain, as do five selectively controllable terminals RAS, WE, D1/DQ0, DO/DQ3 and CAS. Given favorable organization, only the two terminals D1/DQ0 and DO/DQ3 are required as terminals to be actuated selectively, as well as sixteen terminals to be actuated jointly. In the following exemplary embodiments, there are two terminals of the semiconductor chips HSC which are to be actuated selectively. Since the principle of the stack formation is to be illustrated only by way of example, a potentially necessary row or line actuation dependent on the arrangement is not discussed.

FIG. 2 depicts a plan view of a single-layer flexible wiring which was produced using the TAB technique and which comprises a transport perforation TP at the upper and lower margins. This flexible wiring comprises a flexible carrier film TF1 on whose top side a first group of conductors L1 and a second group of conductors L2 are placed without crossings. Two rectangular recesses A are built into the carrier film TF1, into which recesses allocated terminal regions of the conductors L1 and L2 project and respectively form a configuration of inner terminals IA. A first semiconductor memory chip HSC is bonded from above, in the face-down position, by contacts onto the configuration of inner terminals IA which is formed in the region of the upper recess A in FIG. 2. A second semiconductor memory chip HSC of the same type is bonded from below, in the face-up position, by contacts onto the configuration of inner terminals IA which is formed in the region of the lower recess A in FIG. 2. This first group of conductors L1 connects jointly controllable inner terminals IA bonded to contacts of the two semiconductor chips HSC to each other, the individual conductor L1 traversing a strip-shaped bonding region, referenced KB1, in the middle region of the carrier film TF1. The conductors L2 belonging to the second group respectively proceed from selectively controllable inner terminals IA bonded to respective contacts of the two semiconductor chips HSC and lead into the strip-shaped bonding region KB1. A rectangular window F is built into the strip-shaped bonding region KB1 such that all the conductors L1 and L2 are exposed there.

A mirror-symmetrical positioning of the conductors L1 and an essentially mirror-symmetrical positioning of the conductors L2 are enabled by the arrangement of the two semiconductor chips HSC in the face-down position and in the face-up position, which can also be clearly seen in the side view according to FIG. 3. It is thus possible to place all conductors L1 and L2 on one side of the flexible carrier film without crossings.

In the given exemplary embodiment, the carrier film TF1 is formed of a polyimide film 50 $\mu$m thick. The conductors L1 and L2 have been etched from a copper film 25 $\mu$m thick which covers the polyimide film. The two recesses A and the window F can be constructed in the carrier film TF1 by chemical etching, physical etching or laser ablation, for example.

Figure 5:
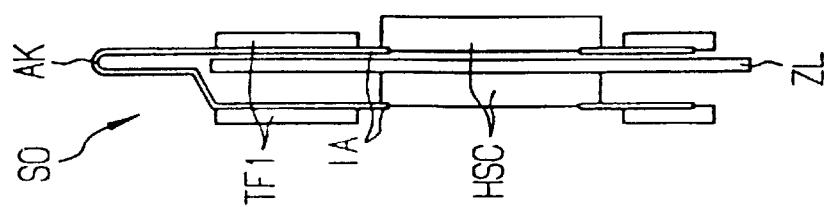
FIG. 5 is a side view of the stack arrangement according to FIG. 4.
Figure 4:
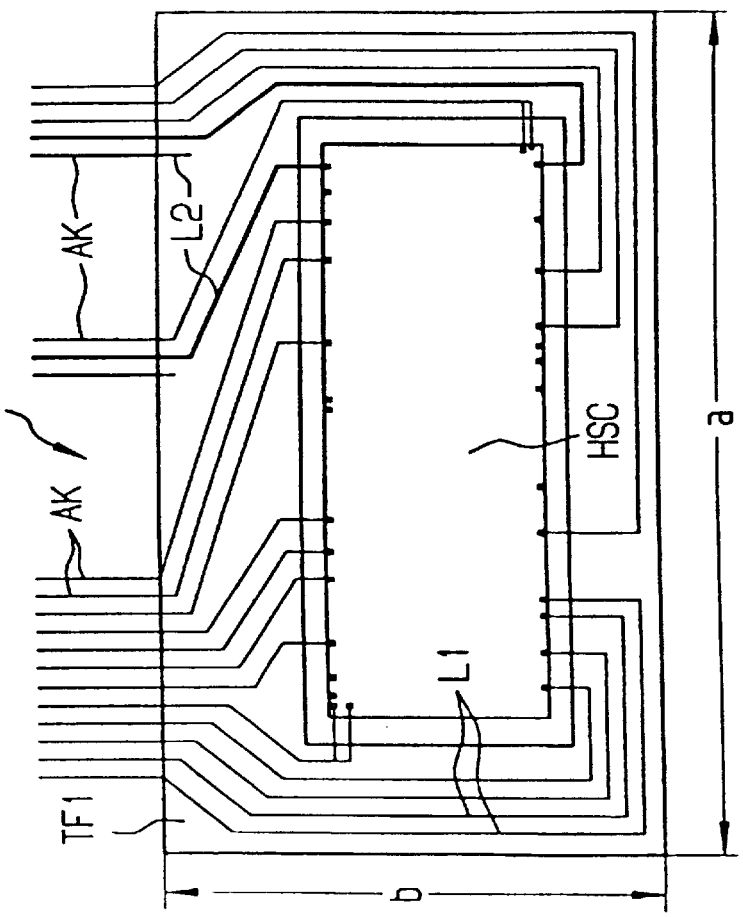
FIG. 4 is a plan view of the stack arrangement according to the FIGS. 2 and 3, subsequent to the folding of the flexible carrier film.

A dotted symmetry line which extends centrally with respect to the strip-shaped bonding region KB1, or centrally with respect to the window F, can be recognized in the FIGS. 2 and 3. This line, referenced BL1, is a matter of an elastic line about which the total arrangement depicted in FIGS. 2 and 3 is folded. The result of this folding is a stack arrangement SO, as depicted in FIG. 4 and FIG. 5, in which the two semiconductor memory chips HSC are congruently situated above one another, given an identical position of the inner terminals. In the folded strip-shaped bonding region KB1, the exposed conductors L1 and L2 form outer contacts AK, which are adjacently situated in one row at the margin side.

Figure 6:
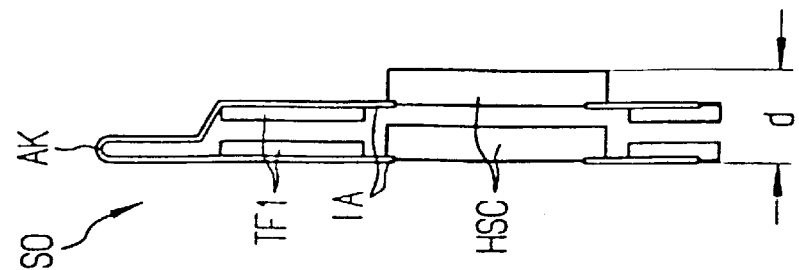
FIG. 6 is a side view of an alternatively folded stack arrangement.

The stack arrangement described above can be created by bending to both sides, the second folding alternative being depicted in FIG. 6. According to FIG. 5, an insulating intermediate layer ZL can be utilized in the folding, or the two halves lie loosely together. For cooling, a metal compound film can also be inlaid. Partial fixing of the two halves or a bonding with cement or film is also possible.

The unneeded margin regions of the flexible carrier film TF1 can be separated prior to, or preferably subsequently to, the folding. In the given exemplifying embodiment, the width, referenced a in FIG. 4, of the stack arrangement SO is about 18 mm, while the height, referenced b, is about 11 mm. The thickness, referenced d in FIG. 6, of the stack arrangement is about 1 mm. The raster or grid, not depicted in FIG. 4, of the outer contacts KA, is about 0.4 mm.

FIG. 7 depicts a plan view of a printed board, referenced LP overall, onto which a total of twelve of the stack arrangements SO depicted in FIGS. 4 and 5 are to be bonded. The printed board LP contains a substrate S made of insulating material, a total of 68 margin contacts RK, which are arranged on the upper marginal side of the substrate S in FIG. 7, a total of 12 groups of inner contacts IK, which are arranged on the substrate S, a first group of interconnects LB1, which extend on the substrate S and which connect jointly controllable inner contacts IK to each other and to allocated margin contacts RK, and a second group of interconnects LB2, which extend on the substrate S and which connect selectively controllable inner contacts IK to allocated margin contacts RK, respectively. The inner contacts IK are matched in their raster and in their number to the outer contacts AK of the stack arrangements SO according to the FIGS. 5 and 6. The inner contacts IK are therein arranged on the substrate S in two rows with six groups, respectively, the interconnects LB1 which are allocated to the jointly controllable outer contacts AK of the stack arrangements SO (cf. FIGS. 4 and 5) being placed onto the substrate S in the form of a U-shaped interconnect or assembly.

A stack arrangement SO is then bonded, with its outer contacts IK (cf. 4 and 5), to each of the twelve groups of inner contacts IK, it being possible to perform such bonding in one working cycle with a strip-shaped soldering tool which is fitted to the corresponding dimensions. FIG. 8 depicts a truncated plan view of the printed board LP with assembled stack arrangements SO. The dimensions of this printed board LP, which is used as a memory card or a memory module, equal 60 mm×94 mm.

Figure 9:
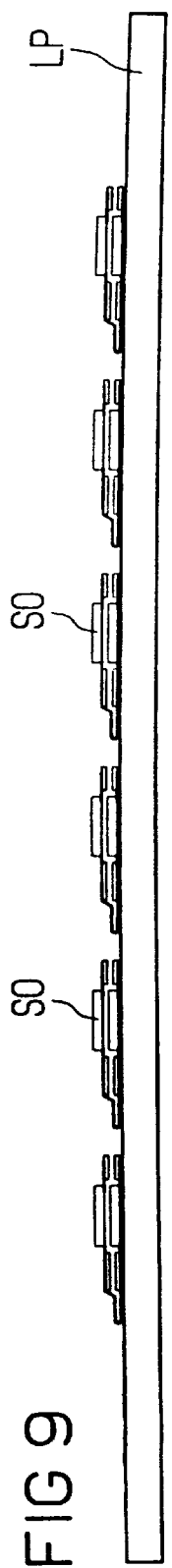
FIG. 9 is a side view of a printed board on which horizontal stack arrangements have been assembled.
Figure 10:
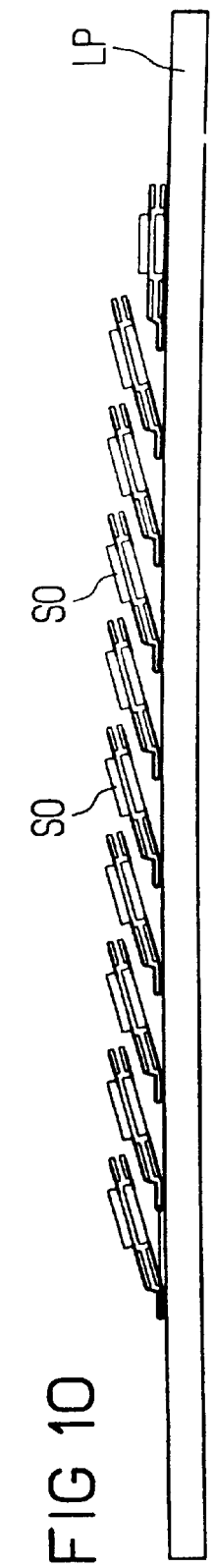
FIG. 10 is a side view of a printed board on which obliquely overlapped stack arrangements have been assembled.
Figure 11:
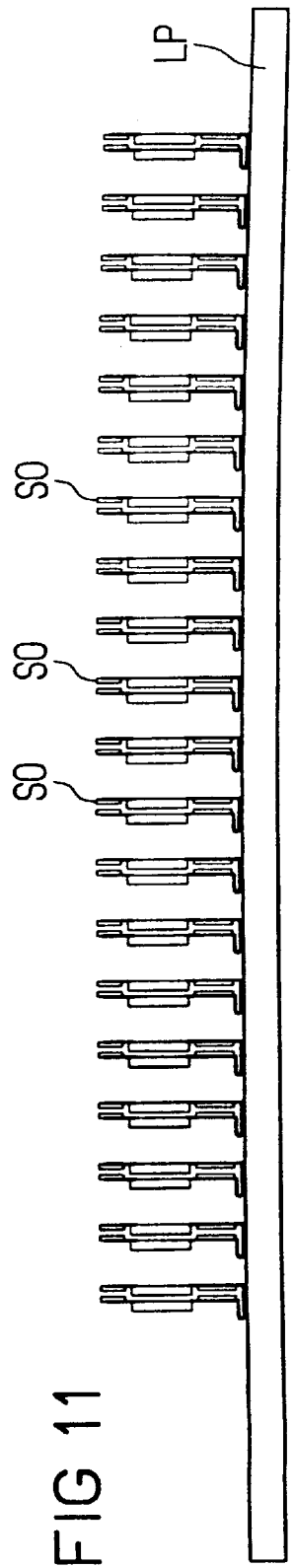
FIG. 11 is a side view of a printed board on which upright stack arrangements have been assembled.

The FIGS. 9 to 11 depict different assembly arrangements of the stack arrangements SO on a printed board LP. FIG. 9 depicts a horizontal arrangement, corresponding to FIG. 8, of the individual stack arrangements SO. The FIGS. 10 and 11 depict an obliquely overlapped arrangement or upright arrangement of the stack arrangements SO on the printed board LP. In principle, a double-sided arrangement of the stack arrangements on a printed board would also be possible. Of course, the achievable packing density also depends on the heat loss to be discharged. Cooling alternatives by means of inserted heat distributers and their thermal coupling at, for example, a metal covering, are also imaginable.

FIGS. 12 and 13 depict a second embodiment of a stack arrangement for two semiconductor memory chips, in an extremely simplified schematic illustration. According to FIG. 12, a flexible carrier film TF2 without recesses for the semiconductor memory chips and without windows in the bending region is utilized, the TAB technique being forgone. All the inner terminals IA are placed on one side of the carrier film TF2. Essentially both groups of conductors also extend on this side, of which only the conductors L1 can be seen in FIG. 12. The individual conductors are fed to the other side of the carrier film TF2 via throughplatings D1 only in the case of a transposition. It can also be seen in FIG. 12 that the two semiconductor memory chips HSC are bonded to the allocated inner terminals IA in face-down position. It is important that all the conductors are fed together via the strip-shaped bonding region referenced KB2, so that the outer contacts AK are formed subsequent to the folding about the elastic line BL2 according to FIG. 13. Given the folding direction indicated by an arrow PF1 in FIG. 12, in the finished stack arrangement according to FIG. 13, the two semiconductor memory chips HSC are situated on opposite outer sides of the stack.

FIGS. 14 and 15 depict a third embodiment of a stack arrangement for two semiconductor memory chips in an extremely simplified schematic illustration. According to FIG. 14, also, a flexible carrier film TF3 without recesses for the semiconductor memory chips and without windows in the bending region is utilized, the TAB technique being forgone. All the inner terminals IA are placed on one side of the carrier film TF3. On this side, also the two semiconductor memory chips HSC are bonded to the allocated inner terminals IA in the face-down position. The two groups of conductors, of which only the conductors L1 can be seen in FIG. 14, then change via throughplating D2 onto the opposite side of the flexible carrier film TF3, on which they are jointly fed via the strip-shaped bonding region referenced KB3. It can also be seen in FIG. 14 that, in case of a transposition, individual conductors are also fed via throughplating D2 onto the side of the flexible carrier TF3 which is situated opposite the two semiconductor memory chips HSC.

Subsequent to the folding of the flexible carrier film TF3 about the elastic line BL3, the conductors according to FIG. 15, which are situated in the strip-shaped bonding region KB3, then form outer contacts AK. Given the folding direction depicted by an arrow PF2 in FIG. 14, in the finished stack arrangement according to FIG. 15, the two semiconductor memory chips HSC are situated in the interior of the stack.

In all the embodiments, different possibilities are available for the bonding of the semiconductor memory chips HSC onto allocated inner terminals IA and for the bonding of the stack arrangements SO onto allocated inner contacts IA of the printed board LP. Thus, semiconductor memory chips HSC with aluminum pads can be connected to the allocated inner terminals IA by thermosonic single bonding. If the semiconductor chips HSC contain humps or peaks, a simultaneous soldering or thermocompression connection is also possible. Pressure connections are also possible using a non-conductive adhesive film. In the exemplifying embodiments given in FIGS. 12 and 13, as well as 14 and 15, besides the flip-chip bonding, even a wire bonding is possible.

The bonding of the stack arrangements SO onto the printed board LP can also be performed as a normal soldering connection to the soldered printed board LP with the aid of the aforementioned strip-shaped soldering tools. An adhesive connection is also possible for additional cost savings, said connection being implemented either as a pressure connection with adhesive film arranged on top, as in the bonding of the semiconductor memory chips HSC, or using an anisotropically conductive adhesive film.

Although various minor modifications might be suggested by those skilled in the art, it should be understood that my wish to embody within the scope of the patent warranted hereon all such modifications as reasonably and properly come with the scope of my contribution to the art.

I claim as my invention:

1. A stack arrangement for first and second semiconductor memory chips, comprising:
    first and second semiconductor memory chips;
    a flexible carrier film made of an electrically insulating material;
    a first configuration of inner terminals onto which first contacts and second contacts of the first semiconductor memory chip are bonded;

a second configuration of inner terminals onto which first contacts and second contacts of the second semiconductor memory chip are bonded;

a first group of conductors on the carrier film which traverse a strip-shaped bonding region associated with the carrier film and which connect to the inner terminals connected to the first contacts of the first and second semiconductor memory chips which are jointly controllable;

a second group of conductors on the carrier film which extend into the strip-shaped bonding region and which connect to the inner terminals connected to the second contacts of the first and second semiconductor memory chips which are selectively controllable; and the flexible carrier film being folded about an elastic line which is situated in the strip-shaped bonding region such that the two semiconductor memory chips are arranged above one another in stacked fashion, and the individual first and second conductor groups in the folded bonding region form outer contacts which are situated in adjacent fashion in one row.

2. The stack arrangement according to claim 1 where all the conductors are placed on one side of the carrier film without crossings, the carrier film is provided with a respective recess in a region of the first and second configurations of inner terminals, the first semiconductor memory chip is bonded via its contacts onto the corresponding inner terminals in a face-up position, and the second semiconductor memory chip is bonded via its contacts onto the corresponding inner terminals in a face-down position.

3. The stack arrangement according to claim 1 wherein a window is built into the carrier film in the strip-shaped bonding region.

4. The stack arrangement according to claim 2 wherein the carrier film is folded such that the two semiconductor memory chips are congruently situated above one another, given an identical position of the terminals.

5. The stack arrangement according to claim 1 wherein all the inner terminals are placed on one side of the carrier film, the conductors are placed on both sides of the carrier film, without crossings, with the aid of throughplatings, and both semiconductor memory chips are bonded via their respective contacts onto the corresponding inner terminals in a face-down position.

6. A printed board assembly, comprising:

first and second semiconductor memory chips;

a flexible carrier film made of an electrically insulating material;

a first configuration of inner terminals onto which first contacts and second contacts of the first semiconductor memory chip are bonded;

a second configuration of inner terminals onto which first contacts and second contacts of the second semiconductor memory chip are bonded;

a first group of conductors on the carrier film which traverse a strip-shaped bonding region associated with the carrier film and which connect to the inner terminals connected to the first contacts of the first and second semiconductor memory chips which are jointly controllable;

a second group of conductors on the carrier film which extend into the strip-shaped bonding region and which connect to the inner terminals connected to the second contacts of the first and second semiconductor memory chips which are selectively controllable;

the flexible carrier film being folded about an elastic line which is situated in the strip-shaped bonding region such that the two semiconductor memory chips are arranged above one another in stacked fashion to form a stack arrangement, and the individual first and second conductor groups in the folded bonding region form outer contacts which are situated in adjacent fashion in one row;

a substrate formed of an electrically insulating material;

a plurality of margin contacts arranged on a marginal side of the substrate;

a plurality of inner contacts arranged on the substrate;

a plurality of said stack arrangements being bonded onto said inner contacts with the corresponding outer contacts of said stack arrangements;

a first group of interconnects which extend on the substrate and which connect jointly controllable outer contacts of the stack arrangements to one other and to allocated margin contacts; and a second group of interconnects which extend on the substrate and which connect selectively controllable outer contacts of the stack arrangements to corresponding margin contacts, respectively.

7. The printed board assembly according to claim 6 wherein the stack arrangements are arranged on the substrate in two adjacently extending rows, the first group of interconnects being placed on the substrate in the form of a U-shaped interconnect assembly.

8. The printed board assembly according to claim 6 wherein the margin contacts, the inner contacts, the first group of interconnects and the second group of interconnects being placed on one side of the substrate.

9. The printed board assembly according to one of the claim 6 wherein the stack arrangements are placed onto the substrate such that they lie flat.

10. The printed board assembly according to one of the claim 6 wherein the stack arrangements are arranged on the substrate such that they are angled behind their outer contacts and are obliquely overlapped.

11. The printed board assembly according to claim 6 wherein the stack arrangements are bent at a right angle behind their outer contacts and are arranged on the substrate in upright fashion.

12. A stack arrangement for first and second semiconductor memory chips, comprising:

first and second memory chips;

a flexible carrier film made of an electrically insulating material and having first, second, and third windows;

a first configuration of inner terminals extending into said first window onto which contacts of the first semiconductor memory are bonded;

a second configuration of inner terminals extending into said second window onto which contacts of the second semiconductor memory chip are bonded;

a group of conductors on the carrier film which traverse a strip-shaped bonding region formed by said third window and which connect to the inner terminals connected to the contacts of the first and second semiconductor memory chips, the third window being positioned between the first and second windows; and the flexible carrier film being folded about an elastic line which is situated in the strip-shaped bonding region such that the two semiconductor memory chips are arranged above one another in stacked fashion, and the conductor groups in the folded bonding region in the third window forming outer contacts for connection to contacts on a board to which said stack arrangement is to be mounted.

13. A printed board assembly, comprising:

first and second memory chips;

a flexible carrier film made of an electrically insulating material and having first, second, and third windows;

a first configuration of inner terminals extending into said first window onto which contacts of the first semiconductor memory are bonded;

a second configuration of inner terminals extending into said second window onto which contacts of the second semiconductor memory chip are bonded;

a group of conductors on the carrier film which traverse a strip-shaped bonding region formed by said third window and which connect to the inner terminals connected to the contacts of the first and second semiconductor memory chips, the third window being positioned between the first and second windows;

the flexible carrier film being folded about an elastic line which is situated in the strip-shaped bonding region such that the two semiconductor memory chips are arranged above one another in stacked fashion to form a stack arrangement, and the conductor group in the folded bonding region in the third window forming outer contacts;

a substrate formed of an electrically insulating material;

a plurality of margin contacts arranged on a marginal side of the substrate;

a plurality of inner contacts arranged on the substrate;

a plurality of said stack arrangements being bonded onto said inner contacts with the corresponding outer contacts of the stack arrangements;

a group of interconnects which extend on the substrate and which connect outer contacts of the stack arrangements to allocated margin contacts.

* * * * *